United States Patent [19]

Prins

[11] Patent Number: 5,609,926
[45] Date of Patent: Mar. 11, 1997

[54] DIAMOND DOPING

[76] Inventor: Johan F. Prins, 8 Portland Place, Northcliff, Johannesburg, South Africa

[21] Appl. No.: 406,559

[22] Filed: Mar. 20, 1995

[30] Foreign Application Priority Data

Mar. 21, 1994 [ZA] South Africa ............................ 94/1962
Sep. 26, 1994 [ZA] South Africa ............................ 94/7485

[51] Int. Cl.$^6$ ................ C23C 14/00; B05D 5/12; H01L 21/265; B01J 3/06
[52] U.S. Cl. ................ 427/523; 427/531; 427/113; 423/446; 437/173
[58] Field of Search ................ 427/523, 533, 427/113, 531, 530, 535, 562; 423/446; 437/173

[56] References Cited

U.S. PATENT DOCUMENTS

| | | |
|---|---|---|
| 4,277,293 | 7/1981 | Nelson et al. ............................ 437/20 |
| 4,976,987 | 12/1990 | Musket et al. ............................ 427/528 |
| 5,034,784 | 7/1991 | Yamazaki ............................ 437/100 |
| 5,075,764 | 12/1991 | Yamazaki ............................ 437/209 |
| 5,252,498 | 10/1993 | Yamazaki ............................ 437/20 |
| 5,328,855 | 7/1994 | Kitabatake et al. ............................ 437/174 |
| 5,385,762 | 1/1995 | Prins ............................ 427/533 |

FOREIGN PATENT DOCUMENTS 0209257 1/1987 European Pat. Off. .
0573312 12/1993 European Pat. Off. .

*Primary Examiner*—Marianne Padgett
*Attorney, Agent, or Firm*—Scully, Scott, Murphy & Presser

[57] ABSTRACT

A method of doping diamond with relatively large atoms such as aluminium, phosphorus, arsenic and antimony is provided. The method involves implanting the dopant atoms at a low temperature to create a damaged region of point defects in the form of vacancies and interstitial dopant atoms within the crystal lattice of the diamond, and annealing the diamond to reduce the lattice damage and cause dopant interstitial atoms to diffuse into lattice positions. The implantation dose will be low and such as to create density of implanted dopant atoms of no greater than $2.5 \times 10^{18}$ cm$^3$.

6 Claims, 1 Drawing Sheet

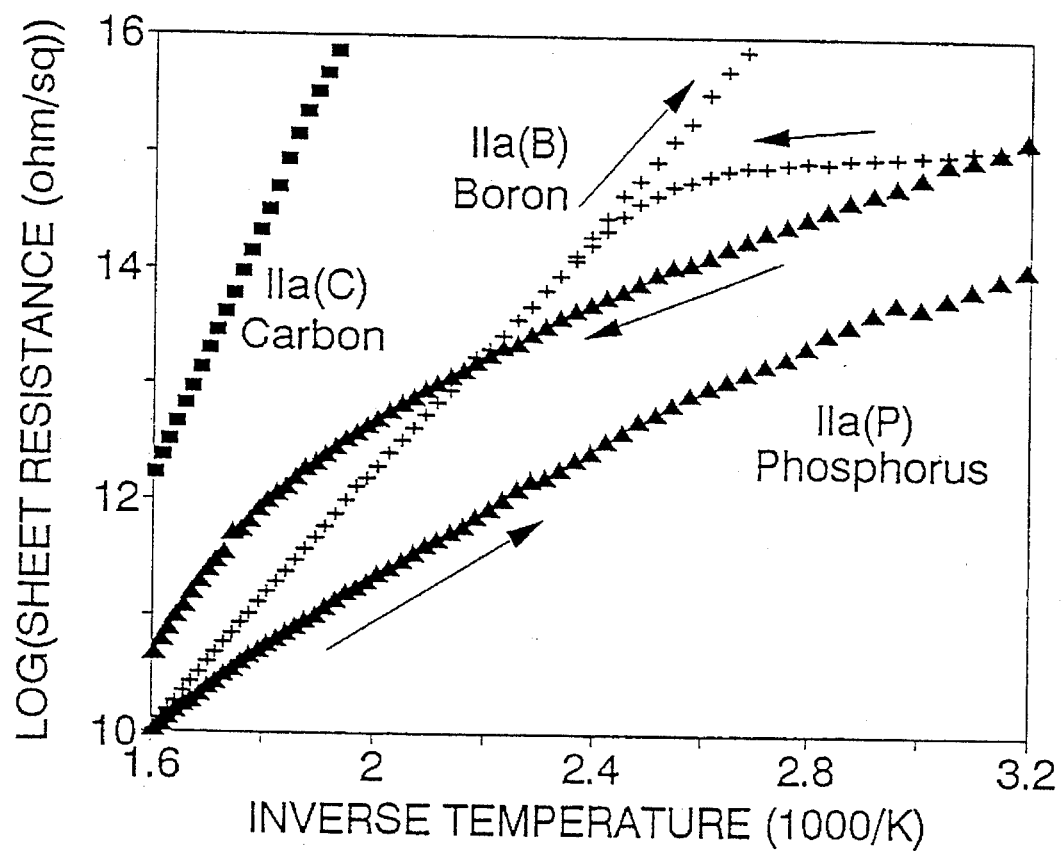

DIAMOND DOPING

BACKGROUND OF THE INVENTION

This invention relates to diamond doping.

The doping of diamond with atoms such as boron, nitrogen, phosphorus, arsenic and the like is known. One such method, described in European Patent No. 0209257, is to create a damaged layer within the diamond by bombardment at low temperature, i.e. that of liquid nitrogen, introduce dopant atoms into the damaged layer at the same, or a similar, low temperature, and then anneal the damaged layer to cause dopant interstitial atom to diffuse to lattice positions and to reduce the lattice damage. The annealing may be rapid annealing.

European Patent Publication No. 0 573 312 describes a similar method to that described above, save that the steps of creating the damaged layer, introducing the dopant atoms and rapid annealing of the doped product is repeated several times until a doped diamond having a desired amount of dopant is produced.

In these methods, the dose of the ion implantation will vary according to the nature and energy of the ions used. The damage will be such as to create point defects (vacancies and interstitials), but not such as to cause amorphisation of the damaged layer. Total doses utilized for carbon, boron and nitrogen are of the order of $10^{15}$ cm$^{-2}$ spread over different energies to create a uniformly damaged layer.

SUMMARY OF THE INVENTION

According to the present invention there is provided a method of producing a doped diamond including the steps of implanting dopant atoms in the diamond at low temperature to create a damaged region of point defects in the form of vacancies and interstitial dopant atoms within the crystal lattice of the diamond and annealing the diamond to reduce lattice damage and cause dopant interstitial atoms to move into lattice positions, the dopant atoms having an atomic number of at least 13 and being capable of providing the diamond with an optical or electrical property when situated in a lattice position in the crystal lattice of the diamond and the implantation dose being selected to create less damage than would be created when carbon atoms are implanted to a density of $2.5 \times 10^{18}$/cm$^3$.

DESCRIPTION OF THE DRAWING

The drawing is a graphical comparison of the sheet resistances for doped type IIa diamonds using low dose C$^+$, B$^+$ and P$^+$ ions respectively, followed by rapid heating or annealing, the energies, doses and rapid annealing conditions being provided hereinafter.

DESCRIPTION OF EMBODIMENTS

The method of the invention allows for the production of diamonds doped with relatively large dopant atoms such as aluminium, arsenic, antimony and phosphorus which atoms are capable of providing the diamond with optical or electrical properties when situated in lattice positions in the crystal lattice of the diamond. The dopant atoms are introduced at total ion doses which are considerably lower than those illustrated and described in the above-mentioned European patent publications. The actual total ion dose used will vary according to the size of the dopant atom, the energy used and the area of the damaged region. Such total dose will, however, be such that it will create less damage than would be created when carbon atoms are implanted to a density of $2.5 \times 10^{18}$/cm$^3$. The effect of this is to introduce less strain into the diamond lattice, yet allow for efficient and effective activation of the dopant atom on subsequent annealing.

Activaton of the implanted dopant atom is achieved by causing the dopant atoms to move into a substitutional or lattice position in the crystal lattice of the diamond. Dopant atoms move by diffusing into a vacancy or a vacancy diffusing to the dopant atom. The driving force for this is the annealing. The annealing is preferably rapid annealing as described, for example, in European Patent Publication No. 0 573 312. The annealing is rapid in the sense that the annealing temperature is reached in a short space of time. How rapid the annealing temperature is reached will be dependent on factors such as the annealing temperature selected and the thickness of the damaged layer or region. Preferably the annealing is such that at the temperature selected, the temperature will be reached before the average time it takes for a self interstitial to move out of the damaged layer. Generally the annealing temperature will be reached in less than 20 seconds and typically less than 1 second. The rapid annealing will generally not exceed 30 minutes. It has been found that activation is preferably achieved by first rapidly annealing at a temperature of less than 1200° C. followed by a second rapid anneal at a temperature of at least 1200° C.

The invention has particular application to the doping of diamond with arsenic, antimony and phosphorus each of which, when electronically activated, can create good qualify n-type conducting layers. Phosphorus is preferred since it has electrons just below the conduction band which makes it an excellent dopant atom for creating n-type conduction. For such atoms, and by way of example, it can be stated that the desired dopant atom density in the diamond may be achieved at total ion doses which are equivalent to a carbon ion dose of less than $5 \times 10^{13}$ over a range of energies up to 150 keV giving an implanted width of about 0.2 microns. Generally, the total ion dose will not be less than $5 \times 10^{10}$ on this basis.

The implantation of dopant atoms takes place at a low temperature in the manner described in the above European patent publications. This generally means that the temperature of implantation will be less than 0° C. and typically at the temperature of liquid nitrogen or lower.

It is possible to create n-type layers, e.g. by implanting phosphorus atoms or ions, and p-type layers, e.g. implanting boron atoms or ions. It is thus possible to create a p-n junction by creating the two types of layers in a substrate. Such p-n junctions may be used in various applications such as diodes, triodes, photovoltaic cells and transistors.

The electrical properties of three type IIa diamonds implanted with C$^+$, B$^+$ and P$^+$ ions were compared such that in each the total amount and distribution of the implanted damage was the same. Owing to the large mass of the P$^+$ ion and the limited capacity in the energy of the ion implanter used it was not possible to implant the phosphorus to the same depths as the C$^+$ and B$^+$ ion. Accordingly, the damage distribution was obtained by implanting C$^+$ ions to the depths the P$^+$ could not reach. The doses used for the three implantations are shown in Table 1. Thus, although the C$^+$ and B$^+$ ions were spread over the whole implantation-damaged layer of width 0.25 microns, the P$^+$ ions were only present to an average depth of ≈0.12 microns (in an equivalent damaged layer).

Diamonds IIa(B), IIa(C), and IIa(P) were implanted with the ions and doses given in Table 1 while maintaining them at liquid nitrogen temperature. Afterwards, each one was rapidly heated from this low temperature to 500° C., i.e. the temperature was reached in less than 20 seconds, and held at this temperature for 30 minutes. This was followed by two further rapid heatings from room temperature to 1200° C. (for 10 minutes) and to 1600° C. (for 2 minutes). The temperatures were again reached in less than 20 seconds. Afterwards the diamonds were cleaned by boiling them in acids. To effect ohmic contacts on diamond IIa(C), the contact areas were overdoped with boron. For the other two diamonds, silver foils were placed on the contact areas before clamping them for resistance measurements. Because very high resistances were anticipated, all the measurements were made using a potential of 50 V.

TABLE 1

ENERGIES, IONS AND DOSES USED FOR THE THREE DIAMONDS.

| DIAMOND IIa (B) BORON Ion: $B^{\perp}$ | | DIAMOND IIa (C) CARBON Ion: $C^{\perp}$ | | DIAMOND IIA (P) PHOSPHORUS Ions: $P^{\perp}$ and $C^{\perp}$ | | |
|---|---|---|---|---|---|---|
| Energy (keV) | Dose ($cm^{-2}$) | Energy (keV) | Dose ($cm^{-2}$) | Ion | Energy (keV) | Dose ($cm^{-2}$) |
| 130 | $2.25 \times 10^{11}$ | 170 | $1.876 \times 10^{11}$ | $C^{\bullet}$ | 170 | $1.876 \times 10^{11}$ |
| 110 | $7.50 \times 10^{10}$ | 140 | $6.280 \times 10^{10}$ | $C^{\bullet}$ | 140 | $6.280 \times 10^{10}$ |
| 100 | $3.75 \times 10^{10}$ | 128 | $3.120 \times 10^{10}$ | $C^{\bullet}$ | 128 | $3.120 \times 10^{10}$ |
| 90 | $3.75 \times 10^{10}$ | 116 | $3.120 \times 10^{10}$ | $C^{\bullet}$ | 116 | $3.120 \times 10^{10}$ |
| 80 | $3.75 \times 10^{10}$ | 103 | $3.120 \times 10^{10}$ | $C^{\perp}$ | 103 | $3.120 \times 10^{10}$ |
| 70 | $3.75 \times 10^{10}$ | 90 | $3.120 \times 10^{10}$ | $C^{+}$ | 90 | $3.120 \times 10^{10}$ |
| 60 | $3.75 \times 10^{10}$ | 77 | $3.120 \times 10^{10}$ | $P^{\perp}$ | 165 | $8.875 \times 10^{9}$ |
| 50 | $3.75 \times 10^{10}$ | 64 | $3.120 \times 10^{10}$ | $P^{\perp}$ | 140 | $8.875 \times 10^{9}$ |
| 40 | $3.75 \times 10^{10}$ | 51 | $3.120 \times 10^{10}$ | $P^{\perp}$ | 113 | $8.875 \times 10^{9}$ |
| 30 | $3.75 \times 10^{10}$ | 37 | $3.120 \times 10^{10}$ | $P^{\perp}$ | 84 | $8.875 \times 10^{9}$ |
| TOTALS: $B^{\perp} = 6 \times 10^{11}$ $cm^{-2}$ | | $C^{+} = 5 \times 10^{11}$ $cm^{-2}$ | | $P^{\bullet} = 3.55 \times 10^{10}$ $cm^{-2}$ | | |

The results, as a function of inverse temperature, are compared in FIG. 1:

1. Diamond IIa(C) only conducted at high temperatures with an activation energy of ≈2.2 eV, which is typical for a type IIa diamond in its virgin state. Thus, the residual damage introduced by the carbon-ion treatment did not lead to a noticable increase in the conductivity.

2. As expected, the boron-doped diamond showed a lower resistance caused by p-type conduction (as checked with a hot probe). However, the activation energy is ≈1.2 eV and not 0.37 eV as expected for p-type diamond. It is known that in cold implantation-rapid annealing, boron-doped diamond there are donors at ≈1.2 to 1.5 eV above the valence band which compensate the acceptors. It would thus seem that in the present case the donor density is slightly more, or near to that of the acceptors. This will move the Fermi level towards the donor position, thus increasing the activation energy. It is interesting to note that this layer is optically very active. After being exposed to light the resistance is much lower at room temperature than shown in FIG. 1. and increased slowly over a long time when keeping the diamond in the dark. This increase can be accelerated by heating the diamond. The curve in FIG. 1 was measured after the resistance had settled down.

3. It will be noted that the $P^+$ cold implantation-rapid annealing treated diamond [IIa(P)] behaved different to diamonds IIa(C) and IIa(B). Even though its contacts were non-linear (non-ohmic), it conducted better at low temperatures, changed resistance at a lower rate, and showed hysteresis between the heating and cooling measurement cycles. Comparing this result to that of diamond IIa(C), which contained the same residual damage, means that the conduction measured in diamond IIa(P) could only have been caused by the presence of the phosphorus. Corresponding results had not been found when using high ion dose phosphorus implantations.

I claim:

1. A method of producing a doped diamond comprising the steps of: (a) implanting at a temperature of below 0° C. dopant atoms in a diamond having a crystal lattice to create a damaged region of point defects, said point defects comprised of vacancies and interstitial dopant atoms within the crystal lattice; and (b) annealing the implanted diamond under conditions effective to reduce lattice damage and cause said interstitial dopant atoms to move into lattice positions within said crystal lattice, wherein the dopant atoms are selected from the group consisting of phosphorus, arsenic and antimony and are capable of providing the diamond with an optical or electrical property when situated in said lattice positions and wherein said implanting is at an implantation dose selected to create less damage than would be created when carbon atoms are implanted to a density of $2.5 \times 10^{18}/cm^3$ using a carbon ion dose of less than $5 \times 10^{13}/cm^2$ over a range of energies up to 150 keV giving an implanted width of 0.2 microns.

2. A method according to claim 1 wherein the annealing temperature is reached in less than 20 seconds.

3. A method according to claim 2 wherein the annealing temperature is reached in less than 1 second.

4. A method according to claim 2 wherein the annealing temperature, once reached, is maintained for a period not exceeding 30 minutes.

5. A method according to claim 2 wherein the annealing comprises a first anneal at a temperature of less than 1200° C. and a second anneal at a temperature of at least 1200° C.

6. A method according to claim 1 wherein the implanting is at a temperature of liquid nitrogen or lower.

* * * * *

UNITED STATES PATENT AND TRADEMARK OFFICE
CERTIFICATE OF CORRECTION

PATENT NO. : 5,609,926
DATED : March 11, 1997
INVENTOR(S) : Johan Frans Prins

It is certified that error appears in the above-indentified patent and that said Letters Patent is hereby corrected as shown below:

Column 2, line 32: "qualify" should read --quality--

Column 3, line 21: "IIA" should read --IIa--

Signed and Sealed this

Tenth Day of March, 1998

*Attest:*

BRUCE LEHMAN

*Attesting Officer*    *Commissioner of Patents and Trademarks*